United States Patent
Thompson et al.

(10) Patent No.: US 7,051,301 B2
(45) Date of Patent: May 23, 2006

(54) SYSTEM AND METHOD FOR BUILDING A TEST CASE INCLUDING A SUMMARY OF INSTRUCTIONS

(75) Inventors: Ryan Clarence Thompson, Loveland, CO (US); John Warren Maly, Laporte, CO (US); Adam Caison Brown, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 238 days.

(21) Appl. No.: 10/676,864

(22) Filed: Oct. 1, 2003

(65) Prior Publication Data

US 2005/0086566 A1   Apr. 21, 2005

(51) Int. Cl.
*G06F 17/50* (2006.01)

(52) U.S. Cl. .................................. 716/4; 716/5; 716/6
(58) Field of Classification Search .................. 716/4–6
See application file for complete search history.

(56) References Cited

U.S. PATENT DOCUMENTS

| | | | |
|---|---|---|---|
| 5,377,203 A | 12/1994 | Khan | |
| 5,815,513 A | 9/1998 | Hiraide | |
| 5,845,234 A | 12/1998 | Testa et al. | |
| 5,956,478 A * | 9/1999 | Huggins | 714/33 |
| 6,006,028 A * | 12/1999 | Aharon et al. | 703/21 |
| 6,308,292 B1 | 10/2001 | Fusco | |
| 6,463,582 B1 * | 10/2002 | Lethin et al. | 717/158 |
| 6,728,564 B1 * | 4/2004 | Lahteenmaki | 600/383 |
| 6,871,298 B1 * | 3/2005 | Cavanaugh et al. | 714/33 |
| 6,918,098 B1 * | 7/2005 | Smith et al. | 716/4 |
| 2002/0093356 A1 * | 7/2002 | Williams et al. | 324/765 |
| 2003/0074640 A1 | 4/2003 | Mandell et al. | |
| 2003/0093773 A1 | 5/2003 | Reed et al. | |
| 2003/0105620 A1 | 6/2003 | Bowen | |
| 2003/0233600 A1 * | 12/2003 | Hartman et al. | 714/32 |
| 2005/0160321 A1 * | 7/2005 | Cleaveland et al. | 714/38 |

* cited by examiner

*Primary Examiner*—Stacy A. Whitmore
*Assistant Examiner*—Naum B. Levin

(57) ABSTRACT

A system and method for building a test case operable to test a circuit design, the test case including a summary of instructions. In one embodiment, an instruction generation engine generates a set of instructions of which at least one instruction includes a temporarily uncommitted value. A first summary generation engine portion generates an interfaceable enumeration of the set of instructions wherein each of the temporarily uncommitted values is denoted by an uncommitted reference. A second summary generation engine portion resolves the respective values of the uncommitted references and generates an interfaceable listing of the uncommitted references and their the respective values. The set of instructions and the interfaceable listing of the resolved uncommitted references may be arranged to form the test case.

27 Claims, 5 Drawing Sheets

SYSTEM AND METHOD FOR BUILDING A TEST CASE INCLUDING A SUMMARY OF INSTRUCTIONS

CROSS-REFERENCE TO RELATED APPLICATION(S)

This application discloses subject matter related to the subject matter disclosed in the following commonly owned patent application: "System and Method for Testing a Circuit Design," filed Oct. 1, 2003, application Ser. No. 10/676,859, in the names of Ryan C. Thompson, John W. Maly, and Zachary S. Smith; and "System and Method for Generating a Test Case," filed Oct. 1, 2003, application Ser. No. 10/676,236, in the names of Ryan C. Thompson, John W. Maly, and Zachary S. Smith, both of which are hereby incorporated by reference for all purposes.

BACKGROUND

The design cycle for a digital integrated circuit is long and expensive. Once the first chip is built, it is very difficult, and often impossible, to debug it by probing internal connections or to change the gates and interconnections. Usually, modifications must be made in the original design database and a new chip must be manufactured to incorporate the required changes. Since this process can take months to complete, chip designers are highly motivated to attempt to perfect the chip prior to manufacturing.

It is therefore essential to identify and quantify the architectural requirements necessary to assure good performance over a wide range of events prior to manufacturing the digital integrated circuit. Accordingly, a simulator comprising program code may be employed to provide a simulation environment that is executable on top of a host computer platform in order to model at least some or all of the functionalities of the desired integrated circuit, for example, a target processor core. The characteristics of the target processor core that the simulator emulates may be specified to include processor architectural model, processor clock speed, cache configuration, disk seek time, memory system bus bandwidth, and numerous other parameters. The resulting software-based target processor core provides the appearance of being a normal processor core while a test generator exercises the target processor core with test cases in order to collect detailed hardware behavior data only available through the use of the simulation. In particular, inputs supplied the test generator define specific hardware functionalities to be tested. The resulting test files the test generator gathers may be subsequently utilized to better understand various aspects of the simulated target processor's core.

By modeling the processor core, simulation is able to provide an accurate model that allows each aspect of the simulated processor core's behavior to match that of a specific target processor core. As a result, simulations can provide visibility that translates into detailed information regarding each aspect of the target processor core's execution behavior. Simulators are not without limitations, however. Debugging the models of the target processor core and the test cases can be a laborious and time consuming task. In particular, analyzing the code or set of instructions that defines the test cases can be a daunting task.

SUMMARY

A system and method are disclosed that provide for building a test case operable to test a circuit design, the test case including a summary of instructions. In one embodiment, an instruction generation engine generates a set of instructions of which at least one instruction includes a temporarily uncommitted value. A first summary generation engine portion generates an interfaceable enumeration of the set of instructions wherein each of the temporarily uncommitted values is denoted by an uncommitted reference. A second summary generation engine portion resolves the respective values of the uncommitted references and generates an interfaceable listing of the uncommitted references and their respective values. The set of instructions and the interfaceable listing of the resolved uncommitted references may be arranged to form the test case.

DETAILED DESCRIPTION OF THE DRAWINGS

Figure 1:
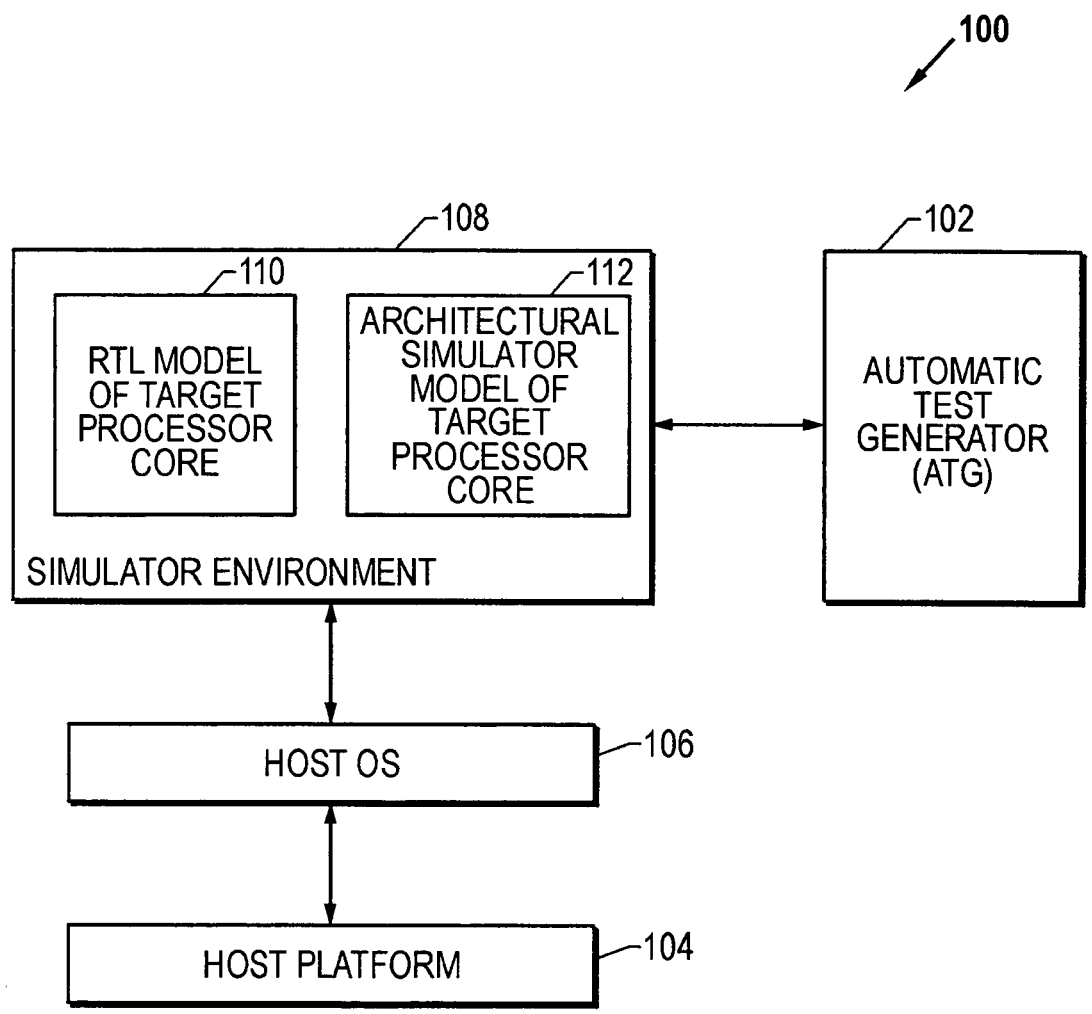
FIG. 1 depicts a block diagram of an embodiment of a system for simulating target processor core models that can be exercised by an Automatic Test Generator (ATG)

In the drawings, like or similar elements are designated with identical reference numerals throughout the several views thereof, and the various elements depicted are not necessarily drawn to scale. Referring now to FIG. 1, therein is depicted an embodiment of a system 100 for simulating target processor core models that can be exercised by an Automatic Test Generator (ATG) 102. A host platform 104 includes a host OS 106 executing thereon that is operable to provide a software platform. A simulator environment 108 is provided as a software rendition capable of running on the host OS 106, and may be embodied as one or more simulated target instances that define a simulated environment. As illustrated, the simulator environment includes a Register-Transfer Level (RTL) model 110 of a target processor core capable of parallel instruction processing, i.e., multi-threading, and an architectural simulator model 112 of the same target processor core. As will be explained in further detail hereinbelow, the ATG 102, responsive to input settings, generates a test case that exercises the behaviors and functionalities of the RTL model 110 and the architectural simulator model 112. The resulting test files are then utilized to understand the behavior of the target processor core.

The RTL model 110 and the architectural simulator model 112 may simulate any processor core having any configuration or digital design. For example, the target processor core may simulate a two-core processor system that delivers high availability and scalability with a wide breadth of enterprise application capabilities. It should be appreciated that depending on the design and verification objectives, the simulator environment 108 may include other types of target processor core models.

The RTL model 110 simulates the target processor core by utilizing a hardware-description language (HDL) that specifies the signal and gate-level behavior of the target processor core. The architectural simulator model 112, on the other hand, provides a higher level of abstraction than the RTL simulator model 110 in order to model the target processor core in terms of a high-level architecture that defines system-level behavioral functionalities of the target processor core. The RTL model 110 may be designed with the aid of computer-aided design (CAD) software tools, also referred to as computer-aided engineering (CAE) software tools, that assist in the development of the conceptual and physical design of the IC as well as the verification of the IC.

Sophisticated CAD software tools contain component libraries and component models that describe in detail the logical and electrical operations of the digital system design of the IC. Using these models, the IC design may be verified so that various types of logic and timing errors may be found by the test generator during the pre-silicon simulation phase of development. Specifically, the RTL model 110 may be designed by a schematic editor in a highly capable HDL environment such as a Very High Speed Integrated Circuit (VHSIC) hardware description language (VHDL) environment, a Verilog description language environment, or an Advanced Boolean Equation Language (ABEL) environment, for example. The HDL language environment provides a design, simulation, and synthesis platform wherein each constituent component within the design can be provided with both a well-defined interface for connecting it to other components and a precise behavioral specification that enables simulation. The architectural model 112, on the other hand, may be implemented in a higher-level language such as C or C++.

Figure 2:
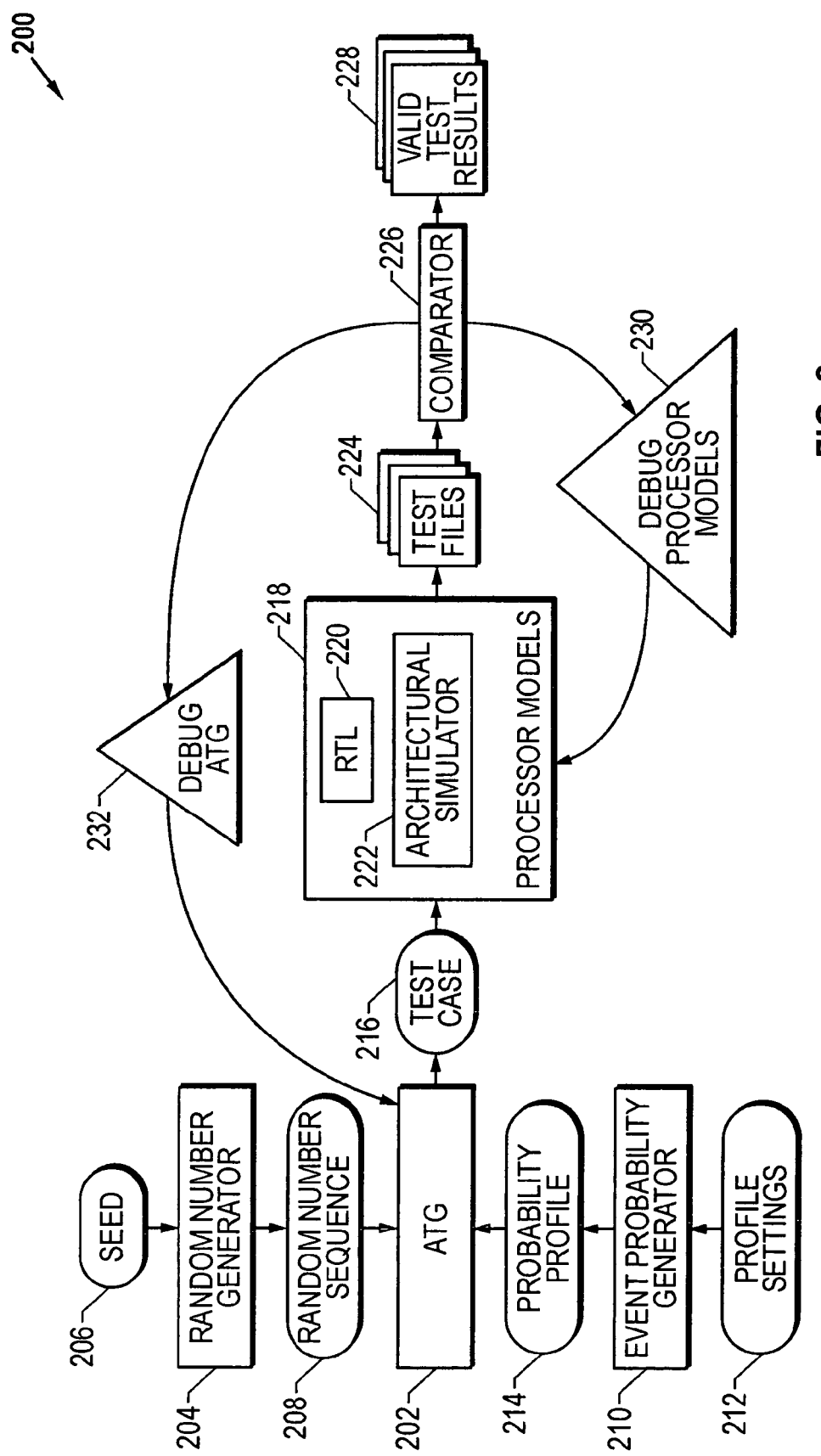
FIG. 2 depicts a block diagram of an embodiment of a system for testing a circuit design using an ATG that is operable to generate a test case in accordance with the teachings described herein.

FIG. 2 depicts a system 200 for testing a circuit design using an ATG 202 that is operable to generate a test case according to one embodiment of the invention. A random number generator 204, responsive to a seed 206, generates a random number sequence 208. In one embodiment, if the seed is a number A, the random number generator 204 generates the random number sequence 208 $\{A_1, A_2, A_3, \ldots, A_n\}$. By way of another example, if the seed 206 provided to the random number generator 204 is B, then the random number sequence 208 generated is $\{B_1, B_2, B_3, \ldots, B_m\}$. Hence, the random number sequence 208 may be considered a function of the seed 206. In another embodiment, the random number sequence 208 may be considered a random sequence of numbers that are "predetermined" based upon the seed 206.

An event probability generator 210, responsive to profile settings 212, generates a probability profile 214. The profile settings 212 are user configurable settings which define the frequency or occurrence of the events that will exercise the processor models. Events include data operations such as loading, storing, and arithmetic operations, for example. Moreover, events include other performance-based operations such as the selection of parameters related to floating-point representations of numbers. The event probability generator 210 reconstitutes the profile settings 212 into the probability profile 214 which defines a set of event-related parametrics that will be accepted by the ATG 202. The ATG 202, responsive to the random number sequence 208 and the probability profile 204, generates a test case 216 in order to exercise the processor models 218. The test case 216 includes a set of instructions comprising computational expressions, which may be executional embodiments of the aforementioned events, expressed in terms of parameters, such as data associated with an address structure or values associated with registers, and operations such as load operations, store operations, and arithmetic operations. For example, an instruction may load to a register N, data 0×10 stored at address 0×1000. An interfaceable summary of the instructions is also included in the test case 216 to illustrate the sequence of instructions that are to be executed while the test case is run on the processor models 218.

The values of the parameters associated with the registers and addresses may or may not be committed at the time the parameters and the instructions concerned with the parameters are generated. Importantly, by delaying the commitment of the values, it should be understood that more interesting test cases may be generated which may more thoroughly exercise the processor models. When the value of a parameter is known, the value is included in the interfaceable summary. In instances where the instructions include a parameter having a temporarily uncommitted value, the interfaceable summary of the instructions assigns an uncommitted reference to the temporarily uncommitted value and presents the temporarily uncommitted value with its respective resolved value in an interfaceable listing within the interfaceable summary. The interfaceable summary portion of the test case 216 including the uncommitted references provides visibility into the various registers instantiated during the execution of a particular test case. This visibility may be utilized in debugging operations, for example.

Additionally, command line settings may also be provided in the generated test case 216 which relate to the starting and stopping of specific actions in the processor models 218 and the defining of testing conditions, such as the number of threads, for example. Further information relative to the generation of simulation parameters for multithreaded test cases may be found in the aforementioned patent application entitled "System and Method for Generating a Test Case," filed Oct. 1, 2003, application Ser. No. 10/676,236, in the names of Ryan C. Thompson, John W. Maly, and Zachary S. Smith, which is hereby incorporated by reference for all purposes.

As illustrated, the test case 216 exercises the RTL model 220 and the architectural simulator model 222 and the results of the exercises are stored as test files 224. A comparator 226, which may be a programmer, a group of programmers, an expert system, or a combination thereof, examines the content of test files 224 to determine if the test results are valid or invalid. In particular, the comparator 226 examines and compares the results provided by the RTL model 220 and the results provided by the architectural simulator model 222. As previously discussed, the RTL model 220 simulates register-level events in the target processor core. The RTL model 220 and the architectural simulator 222, therefore, serve as verification tools for one another. Additionally, the comparator 226 examines the output provided by the RTL model 220 and the architectural simulator 222 to determine if an illegal test behavior has occurred.

If the test files are valid, i.e., the RTL model 220 verifies the architectural simulator model 222 and the test files 224 do not contain illegal test behavior, the test files 224 become valid test results 228 which provide detailed information regarding each exercised aspect of the target processor core's execution behavior. On the other hand, if the test files 224 indicate processor model inconsistencies between the RTL model 220 and architectural simulator 222, then a debugging operation 230 may be required with respect to the processor models. Debugging the architectural simulator and RTL models may involve diagnosing and resolving the problem according to conventional techniques. For example, by examining the test case 216, test files 224, and underlying HDL-based code of the RTL model 220, a clear understanding of the symptoms of the problem may be achieved. Then all of the variables that affect the problem may be identified and the variables progressively eliminated until the root cause of the problem is isolated. Once the root cause is isolated, the HDL-based code of the models may be appropriately modified to eliminate the problem. If the test files 224 indicate the presence of an illegal test behavior, however, the ATG 202 requires a debugging operation 232.

When debugging a test case failure or a particular model, it is useful to compare the values in the instruction summary to the actual values produced when the test case was executed in the process development test environment. For instance, the interfaceable listing of the uncommitted references and their respective values in the interfaceable summary is of particular aid to the comparator 226 during the debugging operations 230 and 232. In particular, by adding a reference to each unique temporarily uncommitted value in the interfaceable summary and summarizing the uncommitted references, a dynamic transparency is added to the processing of the registers and addresses that allows a comparator, such as a programmer or programmer employing an expert system, to determine the progression of any temporarily uncommitted value at different points in the execution of the test case. This temporal transparency provided by the systems and methods described herein translates into an efficient debugging process. Further details relative to the debugging operations within the context of test case generation may be found in the aforementioned patent application entitled "System and Method for Testing a Circuit Design," filed Oct. 1, 2003, application Ser. No. 10/676,859, in the names of Ryan C. Thompson, John W. Maly, and Zachary S. Smith, which is hereby incorporated by reference for all purposes.

Figure 3:
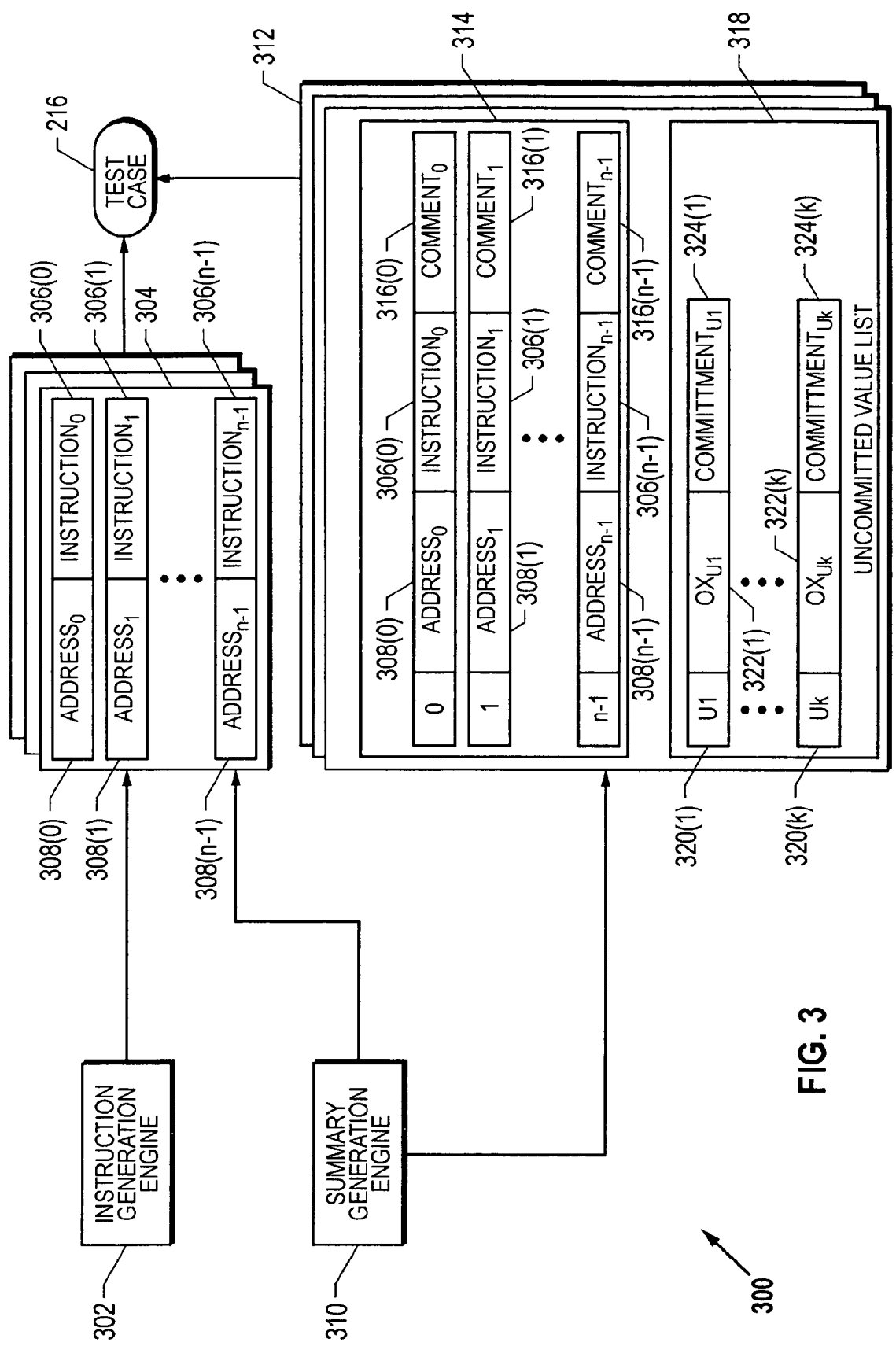
FIG. 3 depicts a block diagram of an embodiment of a system for building a test case with a summary.

FIG. 3 depicts one embodiment of a system 300 for building the test case 216 including an instruction summary. An instruction generation engine 302 forms a portion of the ATG 202 and is operable to generate a set of instructions 304. Each of the N instructions, 306(0) through 306(n-1), is associated with a respective address, 308(0) through 308(n-1). In one implementation, as the instructions are generated, a summary generation engine 310 generates an interfaceable summary 312 of the instructions 306(0) through 306(n-1) that includes an enumeration 314 of the set of instructions 304. Accordingly, the summary generation engine 310 generates comments 316(0) through 316(n-1) that provide additional information about particular instructions such as information relative to uncommitted references that an instruction may have. As will be discussed in more detail hereinbelow, an uncommitted value list 318 is generated as the interfaceable summary 312 is generated or following the generation of the interfaceable summary 312, which includes a listing of all the temporarily uncommitted values 320(1) through 320(k), the respective resolved values 322(1) through 322(k) of the temporarily uncommitted values 320(1) through 320(k), and the enumerated instruction number, i.e., the instruction line number, associated with the instruction that renders committed a particular temporarily uncommitted value, i.e., commitments 324(1) through 324(k). With this scheme, the temporarily uncommitted values may be identified and tracked via a simple and concise interfaceable summary so that a programmer or programmers can advantageously analyze the instructions in order to debug a test case. Those skilled in the art should further recognize that the instruction generation engine 302 and summary generation engine 310, which may be provided as part of an ATG, can be implemented in a programmable language such as C, C++, Perl, or the like.

Figure 4:
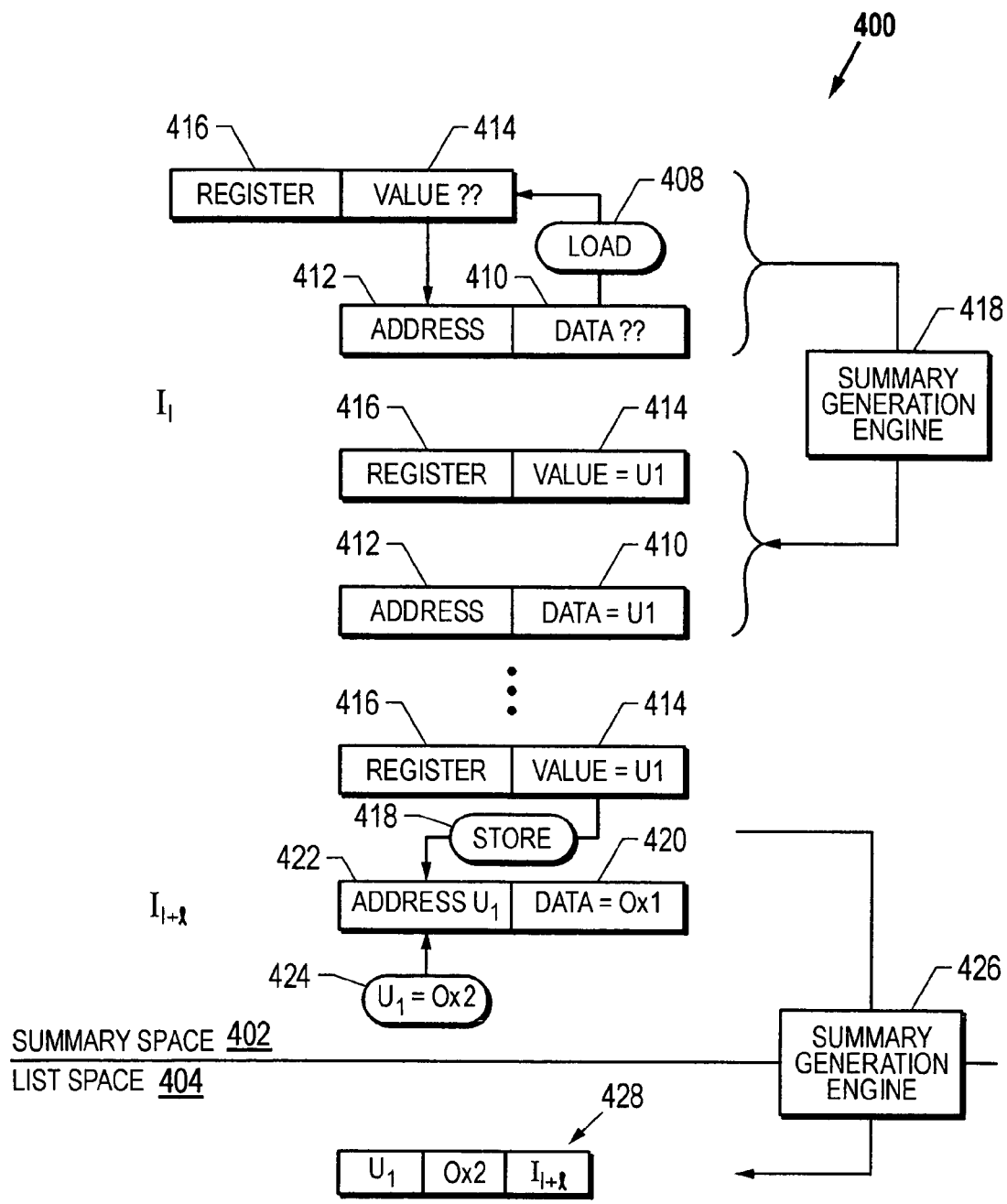
FIG. 4 depicts a block diagram of an embodiment of a summary generation process wherein summary components of the test case are generated.

FIG. 4 depicts one embodiment of a summary generation process 400 wherein summary components of the test case are generated. A summary space 402 represents one embodiment of the operations that the summary generation engine 310 conducts in relation to the enumeration of the instructions 314 and a list space 404 represents one embodiment of the operations that the summary generation engine 310 conducts in relation to the uncommitted value list 318. Instruction 1 ($I_1$) illustrates an instruction where an uncommitted value is encountered; for example, $I_1$ may be a load operation 408 wherein data 410 associated with address 412 is loaded into a register 416 as value 414. As indicated by the "??" expression associated with data 410 that is stored at address 410, the data 410 is uncommitted. Accordingly, as indicated by the "??" expression associated with value 414 that is stored in the register 416, value 414 is also uncommitted. A first portion of summary generation engine 418 is operable to comment on the load operation 408 by assigning an uncommitted reference U1 to each of the data 410 and the value 414. By associating the temporarily unassigned data 410 and the temporarily unassigned value 414 with the uncommitted reference U1, the temporarily unassigned data and value may be tracked as U1 itself is utilized by other instructions, thereby providing transparency into the execution of the test case.

Some instructions later, at a Later Instruction ($I_{1+1}$), a store operation 418 is generated by the ATG 202 which stores data 0x1 420 utilizing the contents of register 416 as its store address 422. Since register 416 is U1, the store address 422 is also U1. As uncommitted reference U1 has no value and the store operation 418 requires an address to store data 0x1, uncommitted reference U1 is resolved by assigning a known value thereto, e.g., the value 0x2 as shown in operation 424. Hence, the temporarily unassigned value U1 becomes committed in association with a later instruction $I_{1+i}$, i.e., the store operation. Once uncommitted reference U1 is committed or following the generation of the entire instruction set of the test case, a second portion of summary generation engine 426 generates an interfaceable listing 428 in list space 404 which includes the uncommitted reference U1, the value of the uncommitted reference 0x2, and the instruction $I_{1+i}$ at which the uncommitted reference became resolved, i.e., committed. The interfaceable listing 428 thereby consolidates and summarizes the roles of the temporarily uncommitted values and uncommitted references in the execution flow of the code.

By way of example, a portion of an instruction summary may have the following appearance:

Instruction Summary:

| Inst. Number | Inst. Address | Instruction | Comments |
|---|---|---|---|
| . | | | |
| . | | | |
| . | | | |
| 5 | 0x005000 | load r5 = [0x1000] | val(r5) = U1 |
| | | | val (0x1000) = U1 |
| 6 | 0x005010 | add r7 = r5 + 0x10 | val(r7) = U2 |
| | | | val (r5) = U1 |
| . | | | |
| . | | | |
| . | | | |

-continued

Instruction Summary:

| Inst. Number | Inst. Address | Instruction | Comments |
|---|---|---|---|
| 20 | 0x006000 | load r5 = [0x2000] | val(r5) = U3<br>val (0x2000) = U3 |
| . | | | |
| 28 | 0x006100 | store [r7] = 0x1234 | val(r7) = 0x3000<br>(assigning U2, U1) |
| . | | | |
| 35 | 0x006200 | store [r5] = 0x5678 | val(r5) = 0x4000<br>(assigning U3) |
| 36 | 0x006300 | add r8 = r7 + 0x20 | val(r7); val (r8) |
| . | | | |
| 40 | 0x007000 | load r9 = [0x1850] | val(r9) = U4<br>val (0x1850) = U4 |

A portion of an uncommitted value list corresponding to the exemplary instruction summary may have the following appearance:

Uncommitted Value List:

| Reference | Value | Inst No. Committed |
|---|---|---|
| U1 | 0x2990 | 28 |
| U2 | 0x3000 | 28 |
| U3 | 0x4000 | 35 |
| U4 | 0x9000 | End |

Instruction line 5 indicates a load operation to register 5 (r5) from address 0x1000 in memory. The data stored at address 0x1000 is uncommitted, so the value stored in r5 is also uncommitted. The value associated with address 0x1000 and the value stored in r5 are then assigned uncommitted reference U1. Instruction line 6 provides an add operation for adding 0x10 to the value stored in r5 and store the result in register 7 (r7). Since r5 is uncommitted, r7 is also uncommitted and as indicated under the comments heading, r7 is assigned uncommitted reference U2.

Instruction line 20 indicates a second load operation to r5. This load operation to r5 from address 0x2000 overrides the previous contents of r5. The content of address 0x2000 is uncommitted, so the new overriding contents of r5 is unknown as well. In order to track this temporarily uncommitted value, the value stored in r5 is assigned the uncommitted reference U3. By assigning the old contents of r5 the uncommitted reference U1 and the new overriding contents of r5 the uncommitted reference U3, temporal transparency is provided into the execution flow of the test case that permits a comparator to track the values associated with r5 at different points in the test case flow. Instruction line 28 indicates a store instruction wherein the value in r7, i.e., uncommitted reference U2, is the store address. Since the store address must be known, the value 0x3000 is assigned to uncommitted reference U2. Based on the relationship of instruction line 6, i.e., U2=U1+0x10, the value of uncommitted reference U1 is recursively determined. It should be appreciated that once all of the interrelationships of an uncommitted reference are resolved, i.e., once all of the variables that an uncommitted reference depends upon are known, the value of the uncommitted reference may be recursively determined by solving resultant simultaneous multiple linear equations, for example.

Similarly, instruction line 35 indicates a store instruction wherein the data 0x5678 is stored using the value in r5, i.e., uncommitted reference U3 as its store address. Hence, the summary generation engine commits U3 to 0x4000. Instruction line 36 indicates an addition operation involving register 8 (r8). As the value of r7 is known, the value of r8 is known and it is not necessary to create an uncommitted reference for r8. Instruction line 40 indicates that the data associated with address 0x1850 is loaded to register 9 (r9). Since the value of the data associated with address 0x1850 is uncommitted, the value loaded in r9 is uncommitted and assigned uncommitted reference U4. The ATG does not refer to uncommitted reference U4 in the remainder of the generated instructions. At the end of the instruction generation, U4 is assigned the value 0x9000 as all uncommitted references, i.e., all temporarily uncommitted values, must have a value prior to the execution of the instruction set on the processor models.

At the end of the generation of the instructions, the summary generation engine builds the uncommitted value list which includes the values assigned for uncommitted references U1, U2, U3, and U4 and the line numbers of instructions that caused the respective values to be committed. As previously mentioned, the dynamic transparency provided by the uncommitted reference structure described herein may be employed in debugging operations. For example, if two processor models, such as an RTL model and an architectural simulator model, disagree on the value loaded from memory for a particular instruction, such as instruction line 5, in order to determine the value loaded into r5, the comparator consults the instruction summary and uncommitted value list. Without the teachings described herein, however, following the execution of the test case, the comparator would examine, starting at instruction line 5, all the instruction lines in order to find expressions containing r5 and expressions relating to other uncommitted references, such as r7, that relate to r5. Continuing with the this example, instruction line 6 would also require analysis as it defines a relationship between r7 and r5. Additionally, instruction lines 20, 28, and 35 would require further examination in order to determine the values of r5. It should therefore be appreciated that the visibility provided by the present invention's uncommitted reference value resolution scheme provides a better alternative to the comparator performing tedious inquiries with respect to any temporarily unassigned values that may be associated with registers, addresses, or data values.

Figure 5:
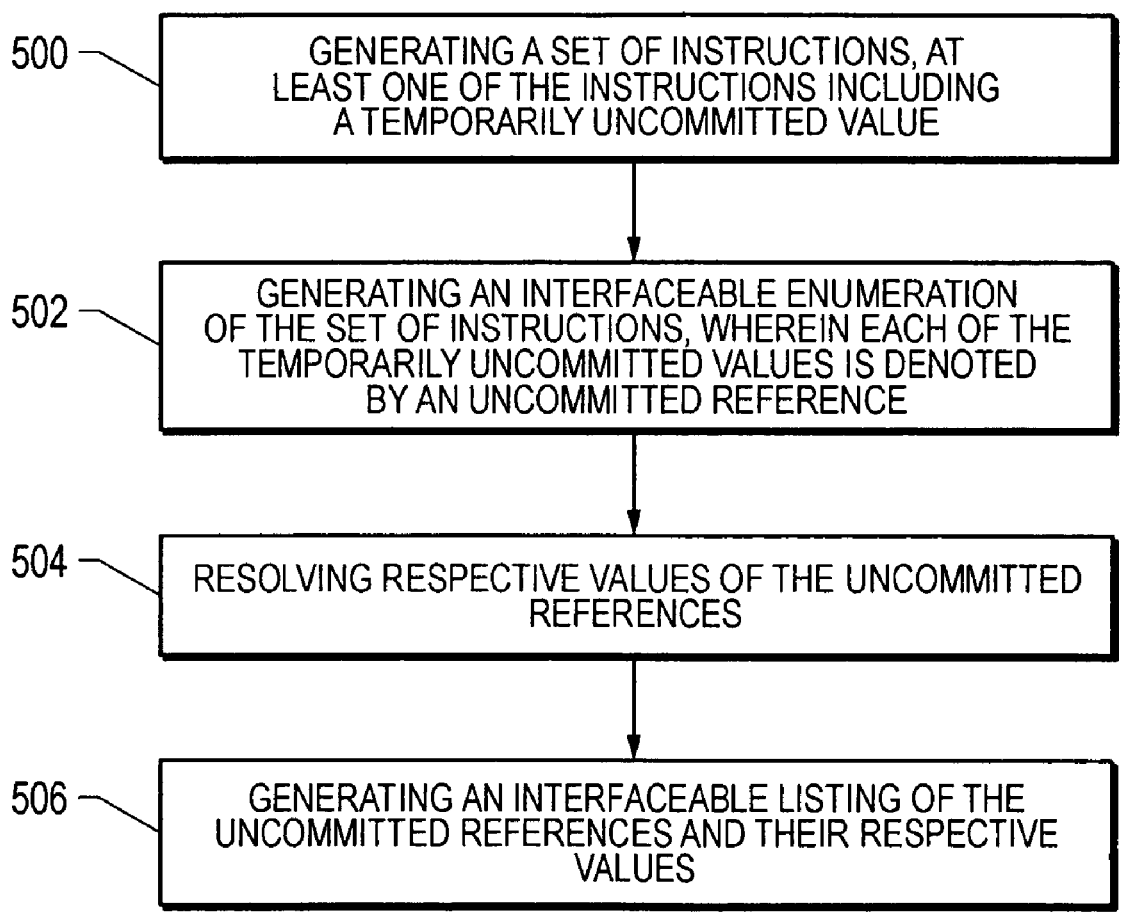
FIG. 5 depicts a flow chart of an embodiment of a method of building a test case.

FIG. 5 depicts one embodiment of a method of building a test case. At block 500, a set of instructions is generated of which at least one instruction includes a temporarily uncommitted value. At block 502, an interfaceable enumeration of the set of instructions is generated, wherein each of the temporarily uncommitted values is denoted by an uncommitted reference. At block 504, respective values of the uncommitted references are resolved. At block 506, an interfaceable listing of the uncommitted references and their respective values is generated. The interfaceable instruction summary and the listing of the resolved uncommitted references may be provided via a conventional graphical user interface (GUI), hard copy, or the like.

Although the invention has been particularly described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A system for building a test case operable to test a circuit design, comprising:
   an instruction generation engine for generating a set of instructions comprising computational expressions, at least one of said instructions including a temporarily uncommitted value;
   a first summary generation engine portion for generating an interfaceable enumeration of said set of instructions, wherein each of said temporarily uncommitted values is denoted by an uncommitted reference; and
   a second summary generation engine portion for resolving respective values of said uncommitted references and generating an interfaceable listing of said uncommitted references and their said respective values,
   wherein said set of instructions and a summary including said interfaceable listing of said uncommitted references with resolved values are arranged to form said test case.

2. The system as recited in claim 1, wherein said temporarily uncommitted value relates to a data value at an address location.

3. The system as recited in claim 1, wherein said temporarily uncommitted value relates to an address location.

4. The system as recited in claim 1, wherein said set of instructions includes operations selected from at least one of loads, stores, and arithmetic operations.

5. The system as recited in claim 1, wherein said summary further includes said interfaceable enumeration of said set of instructions, each of said temporarily uncommitted values being denoted by an uncommitted reference.

6. The system as recited in claim 1, wherein said first summary generation engine portion generates said interfaceable enumeration as said instruction generation engine generates said set of instructions.

7. The system as recited in claim 1, wherein said instructions are operable to exercise a register-transfer level (RTL) model of an integrated circuit.

8. The system as recited in claim 1, wherein said instructions are operable to exercise an architectural simulation model of an integrated circuit.

9. The system as recited in claim 1, wherein said second summary generation engine portion resolves said respective values by recursively solving for said uncommitted references.

10. The system as recited in claim 1, wherein said second summary generation engine portion resolves said respective values by assigning a value to said uncommitted references.

11. The system as recited in claim 1, wherein said first and second summary generation engine portions are implemented in a software language selected from at least one of C, C++, and Perl.

12. A method for building a test case operable to test a circuit design, comprising:
    generating a set of instructions comprising computational expressions, at least one of said instructions including an expression having a temporarily uncommitted value;
    generating an interfaceable enumeration of said set of instructions, wherein each of said temporarily uncommitted values is denoted by an uncommitted reference;
    resolving respective values of said uncommitted references;
    generating an interfaceable listing of said uncommitted references and their said respective values; and
    associating said set of instructions with said interfaceable enumeration of said set of instructions and said interfaceable listing of resolved uncommitted references, thereby forming said test case.

13. The method as recited in claim 12, wherein said operation of generating an interfaceable enumeration of said set of instructions occurs substantially simultaneously with said operation of generating a set of instructions.

14. The method as recited in claim 12, wherein said operation of resolving respective values of said uncommitted references further comprises recursively solving said uncommitted references.

15. The method as recited in claim 12, wherein said operation of resolving respective values of said uncommitted references further comprises assigning a value to said uncommitted references.

16. The method as recited in claim 12, further comprising utilizing said interfaceable listing in a debugging operation.

17. A computer-readable medium operable with a computer platform to build a test case for testing a circuit design, the medium having stored thereon:
    program code for generating a set of instructions comprising computational expressions, at least one of said instructions including an expression having a temporarily uncommitted value;
    program code for generating an interfaceable enumeration of said set of instructions, wherein each of said temporarily uncommitted values is denoted by an uncommitted reference;
    program code for resolving respective values of said uncommitted references;
    program code for generating an interfaceable listing of said uncommitted references and their said respective values; and
    program code for associating said set of instructions with said interfaceable enumeration of said set of instructions and said interfaceable listing of resolved uncommitted references.

18. The computer-readable medium as recited in claim 17, wherein said program code for generating an interfaceable enumeration of said set of instructions is executed substantially simultaneously with said program code for generating a set of instructions.

19. The computer-readable medium as recited in claim 17, wherein said program code for resolving respective values of said uncommitted references further comprises program code for recursively solving said uncommitted references.

20. The computer-readable medium as recited in claim 17, wherein said program code for resolving respective values of said uncommitted references further comprises program code for assigning a value to said uncommitted references.

21. A computer system operable to simulate a platform for testing a circuit design, the computer system comprising:
    a random number generator, operating responsive to a seed, for generating a random number sequence;
    an event probability generator, operating responsive to profile settings, for generating a probability profile; and
    a test generator, operating responsive to said random number sequence and said probability profile, for generating a test case including a set of instructions that comprise computational expressions and an interfaceable summary of said set of instructions,
    wherein said set of instructions includes at least one expression having a temporarily uncommitted value that is resolved by said test generator and presented in said interfaceable summary.

22. The computer system as recited in claim 21, wherein said test case is operable to exercise a register-transfer level (RTL) model of an integrated circuit.

23. The computer system as recited in claim 21, wherein said test case is operable to exercise an architectural simulation model of an integrated circuit.

24. The computer system as recited in claim 21, wherein said test generator is implemented in a software language selected from at least one of C, C++, and Perl.

25. The computer system as recited in claim 21, wherein said temporarily uncommitted value relates to a data value at an address location.

26. The computer system as recited in claim 21, wherein said temporarily uncommitted value relates to an address location.

27. A system for building a test case operable to test a circuit design, comprising:

means for generating a set of instructions comprising computational expressions, at least one of said instructions including an expression having a temporarily uncommitted value;

means for generating an interfaceable enumeration of said set of instructions, wherein each of said temporarily uncommitted values is denoted by an uncommitted reference;

means for resolving respective values of said uncommitted references;

means for generating an interfaceable listing of said uncommitted references and their said respective values; and means for associating said set of instructions with said interfaceable enumeration of said set of instructions and said interfaceable listing of resolved uncommitted references, thereby forming said test case.

* * * * *

UNITED STATES PATENT AND TRADEMARK OFFICE
CERTIFICATE OF CORRECTION

PATENT NO. : 7,051,301 B2  Page 1 of 1
APPLICATION NO. : 10/703936
DATED : May 23, 2006
INVENTOR(S) : Xiang et al.

It is certified that error appears in the above-identified patent and that said Letters Patent is hereby corrected as shown below:

On the cover page, item [57]
In the Abstract, Line 2, delete "," and insert -- . --

Column 6
Line 21, delete "either" and insert -- one of the --
Line 30, delete "signal test" and insert -- test signal --
Lines 40, 62, 63, delete "P1$j$" and insert-- P$Ij$ --

Column 7
Lines 5 and 9, delete "P1$j$" and insert -- P$I_j$ --
Line 8, delete "p1$j$" and insert-- P$I_j$ --
Line 15, delete "$l_i$," and insert -- $l_t$, --
Line 20, delete "$i_j$>i" and insert -- $i_j$>I --
Line 32, delete "P1$j$" and insert-- P$I_j$--

Column 8
Line 11, delete "P$L_k$" and -- P$I_k$ --
Line 13, delete "P1$_1$, P1$_2$, . . . , P1$_k$" and insert -- P$I_1$, P$I_2$, . . . ,P$I_k$, --
Line 14, delete "input" and insert -- inputs --

Signed and Sealed this

Eighth Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 7,051,301 B2  Page 1 of 1
APPLICATION NO. : 10/676864
DATED : May 23, 2006
INVENTOR(S) : Ryan Clarence Thompson et al.

It is certified that error appears in the above-identified patent and that said Letters Patent is hereby corrected as shown below:

In column 6, line 31, delete "$(I_{1+1})$" and insert -- $(I_{1+l})$ --, therefor.

Signed and Sealed this

Fifth Day of January, 2010

David J. Kappos
*Director of the United States Patent and Trademark Office*